US008373188B2

(12) United States Patent
Suh et al.

(10) Patent No.: US 8,373,188 B2
(45) Date of Patent: Feb. 12, 2013

(54) LIGHT EMITTING DIODE HAVING DISTRIBUTED BRAGG REFLECTOR

(75) Inventors: Duk Il Suh, Ansan-si (KR); Jae Moo Kim, Ansan-si (KR); Kyoung Wan Kim, Ansan-si (KR); Yeo Jin Yoon, Ansan-si (KR); Ye Seul Kim, Ansan-si (KR); Sang Hyun Oh, Ansan-si (KR); Jin Woong Lee, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 0 days.

(21) Appl. No.: 13/100,879

(22) Filed: May 4, 2011

(65) Prior Publication Data
US 2012/0025244 A1 Feb. 2, 2012

(30) Foreign Application Priority Data

Jul. 28, 2010 (KR) .................. 10-2010-0072822
Aug. 10, 2010 (KR) .................. 10-2010-0076914

(51) Int. Cl.
*H01L 33/00* (2010.01)
(52) U.S. Cl. ............. 257/98; 257/89; 257/E33.069
(58) Field of Classification Search .......... 257/79, 257/89, 98, E33.068, E33.069; 438/29
See application file for complete search history.

(56) References Cited

U.S. PATENT DOCUMENTS

| 7,622,746 B1 * | 11/2009 | Lester et al. ............ 257/98 |
| 2008/0303047 A1 * | 12/2008 | Shen et al. ............ 257/98 |
| 2008/0303052 A1 * | 12/2008 | Lee et al. ............ 257/99 |
| 2010/0001258 A1 * | 1/2010 | Shimizu et al. ......... 257/13 |
| 2010/0225226 A1 * | 9/2010 | Murazaki et al. ....... 313/503 |

FOREIGN PATENT DOCUMENTS

| JP | 11-126925 | 5/1999 |
| KR | 10-2005-0014343 | 2/2005 |
| KR | 10-2005-0096010 | 10/2005 |
| KR | 10-2007-0072826 | 7/2007 |
| KR | 10-2008-0017180 | 2/2008 |
| WO | WO 2011/016820 A2 * | 2/2011 |

OTHER PUBLICATIONS

Unpublished U.S. Appl. No. 12/917,937 of Chung Hoon Lee, et al., filed Nov. 2, 2010.

* cited by examiner

*Primary Examiner* — Tuan N. Quach
(74) *Attorney, Agent, or Firm* — H.C. Park & Associates, PLC

(57) ABSTRACT

Exemplary embodiments of the present invention provide light-emitting diodes having a distributed Bragg reflector. A light-emitting diode (LED) according to an exemplary embodiment includes a light-emitting structure arranged on a first surface of a substrate, the light-emitting structure including a first conductivity-type semiconductor layer, a second conductivity-type semiconductor layer, and an active layer interposed between the first conductivity-type semiconductor layer and the second conductivity-type semiconductor layer. A first distributed Bragg reflector is arranged on a second surface of the substrate opposite to the first surface, the first distributed Bragg reflector to reflect light emitted from the light-emitting structure. The first distributed Bragg reflector has a reflectivity of at least 90% with respect to light of a first wavelength in a blue wavelength range, light of a second wavelength in a green wavelength range, and light of a third wavelength in a red wavelength range. The first distributed Bragg reflector has a laminate structure having an alternately stacked $SiO_2$ layer and $Nb_2O_5$ layer.

26 Claims, 7 Drawing Sheets

Prior Art

LIGHT EMITTING DIODE HAVING DISTRIBUTED BRAGG REFLECTOR

CROSS-REFERENCE TO RELATED APPLICATIONS

This application claims priority from and the benefit of Korean Patent Application No. 10-2010-0072822, filed on Jul. 28, 2010, and Korean Patent Application No. 10-2010-0076914, filed on Aug. 10, 2010, which are hereby incorporated by reference for all purposes as if fully set forth herein.

BACKGROUND OF THE INVENTION

1. Field of the Invention

Exemplary embodiments of the present invention relate to a light-emitting diode and, more particularly, to a light-emitting diode having a distributed Bragg reflector.

2. Discussion of the Background

Gallium nitride (GaN)-based blue or ultraviolet (UV) light-emitting diodes (LEDs) may be used in a wide range of applications. In particular, various kinds of LED packages for emitting light having mixed colors, for example, white light, have been applied to backlight units, general lighting devices, and the like.

Since optical power of the LED package may depend upon luminous efficiency of an LED, numerous studies have focused on development of LEDs having improved luminous efficiency. For example, a metal reflector may be formed on a lower surface of a transparent substrate such as a sapphire substrate to improve light extraction efficiency of the LED.

FIG. 1 shows reflectivity of a sapphire substrate having an aluminum layer formed on a lower surface thereof.

Referring to FIG. 1, a sapphire substrate having no aluminum layer exhibits a reflectivity of about 20%, whereas the sapphire substrate having an aluminum layer exhibits a reflectivity of about 80% over the entire visible spectrum.

FIG. 2 shows reflectivity of a sapphire substrate having a distributed Bragg reflector formed by alternately stacking $TiO_2/SiO_2$ on a lower surface thereof.

When the substrate is formed with the distributed Bragg reflector instead of the aluminum layer, the substrate exhibits a reflectivity approaching 100% for light in the blue wavelength range, for example in a wavelength range of 400 nm to 500 nm and having a peak wavelength of 460 nm, as shown in FIG. 2.

However, the distributed Bragg reflector may only increase reflectivity in certain regions of the visible spectrum and may exhibit significantly lower reflectivity in other regions. In other words, as shown in FIG. 2, the reflectivity rapidly decreases at a wavelength of about 520 nm or more and is less than 50% at a wavelength of 550 nm or more.

Accordingly, when an LED with the distributed Bragg reflector is mounted on an LED package for emitting white light, the distributed Bragg reflector of the LED may exhibit high reflectivity with respect to light in the wavelength range of blue light emitted from the LED, but may not exhibit effective reflective characteristics with respect to light in the wavelength ranges of green and/or red light, thereby restricting improvement in light emission efficiency of the LED package.

A GaN-based semiconductor has an index of refraction of about 2.4. Accordingly, there may be a difference in index of refraction between the GaN-based semiconductor and external air or a molding resin, so light generated in the active layer may be trapped by the semiconductor layer and not be emitted to the outside due to total internal reflection at an interface therebetween.

SUMMARY OF THE INVENTION

Exemplary embodiments of the present invention provide an LED for an LED package to emit light having mixed colors, for example, white light.

Exemplary embodiments of the present invention provide an LED to improve light emission efficiency of an LED package.

Exemplary embodiments of the present invention provide an LED to prevent optical loss inside the LED when light enters the LED from outside of the LED.

Exemplary embodiments of the present invention provide an LED to prevent optical loss caused by total internal reflection.

Additional features of the invention will be set forth in the description which follows, and in part will be apparent from the description, or may be learned by practice of the invention.

An exemplary embodiment of the present invention provides a light-emitting diode including a light-emitting structure arranged on a first surface of a substrate, the light-emitting structure including a first conductivity-type semiconductor layer, a second conductivity-type semiconductor layer, and an active layer interposed between the first conductivity-type semiconductor layer and the second conductivity-type semiconductor layer. The light-emitting diode includes a first distributed Bragg reflector arranged on a second surface of the substrate opposite to the first surface, the first distributed Bragg reflector to reflect light emitted from the light emitting structure. The first distributed Bragg reflector has a reflectivity of at least 90% with respect to light of a first wavelength in a blue wavelength range, light of a second wavelength in a green wavelength range, and light of a third wavelength in a red wavelength range. The first distributed Bragg reflector has a laminate structure having an alternately stacked $SiO_2$ layer and an $Nb_2O_5$ layer.

An exemplary embodiment of the invention also discloses a light emitting diode including a light-emitting structure arranged on a first surface of a substrate, the light-emitting structure including a first conductivity-type semiconductor layer, a second conductivity-type semiconductor layer, and an active layer interposed between the first conductivity-type semiconductor layer and the second conductivity-type semiconductor layer. The light-emitting diode includes an insulation layer arranged on the light-emitting structure, a distributed Bragg reflector arranged on a second surface of the substrate opposite to the first surface, the distributed Bragg reflector to reflect light emitted from the light-emitting structure, and a reflective metal layer, the distributed Bragg reflector arranged between the substrate and the reflective metal layer. The distributed Bragg reflector has a reflectivity of at least 90% with respect to light of a first wavelength in a blue wavelength range, light of a second wavelength in a green wavelength is range and light of a third wavelength in a red wavelength range.

An exemplary embodiment of the present invention also discloses a light-emitting diode including a substrate, a light emitter arranged on a first surface of the substrate, and a reflector arranged on a second surface of the substrate opposite to the first surface, the reflector to reflect light emitted from the light emitter. The reflector includes $SiO_2$ layers and $Nb_2O_5$ layers that are alternately arranged on each other.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
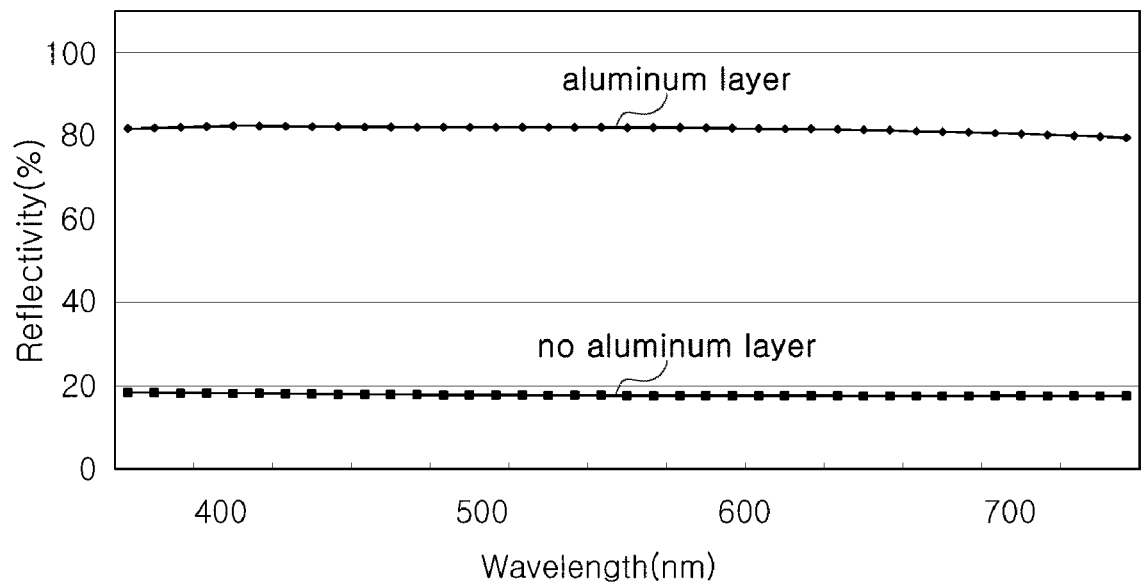
FIG. 1 is a graph showing reflectivity of aluminum on a sapphire substrate.
Figure 2:
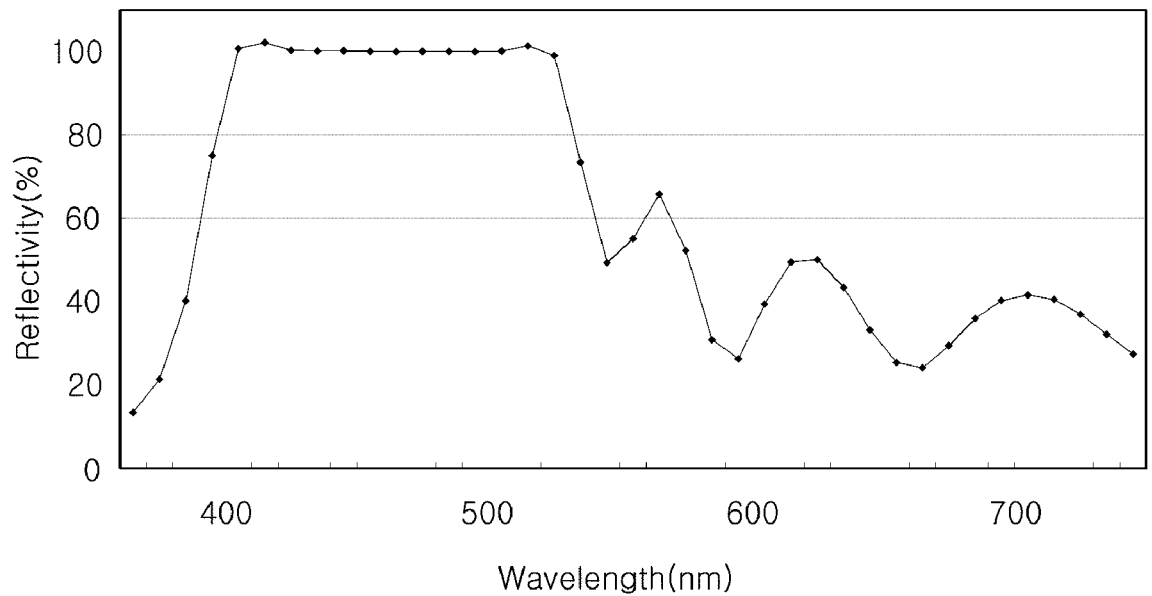
FIG. 2 is a graph showing reflectivity of a distributed Bragg reflector on a sapphire substrate.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or is substrate is referred to as being "on" another element, it can be directly on the other element or intervening elements may also be present. In contrast, when an element is referred to as being "directly on" another element, there are no intervening elements present.

Figure 3:
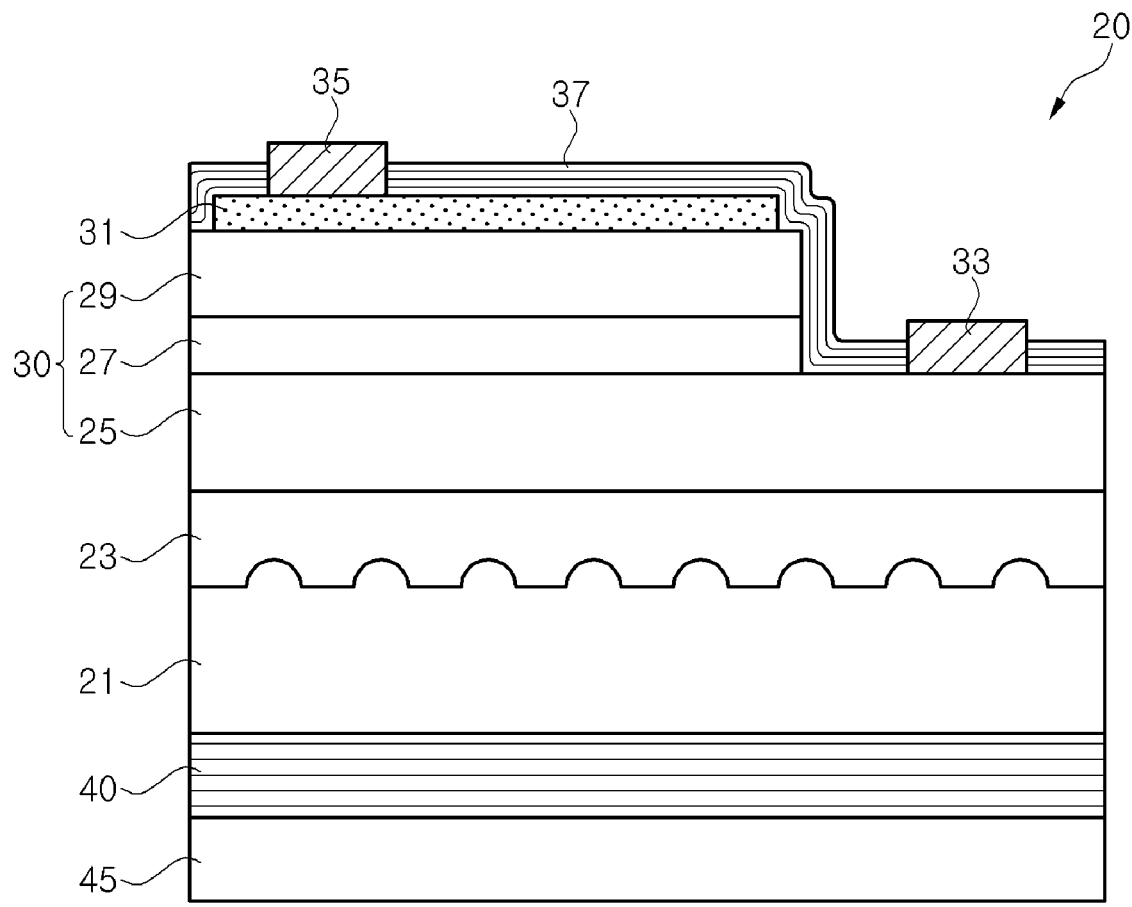
FIG. 3 is a sectional view of a light-emitting diode (LED) having a distributed Bragg reflector according to an exemplary embodiment of the present invention.

FIG. 3 is a sectional view of a light emitting diode 20 having a distributed Bragg reflector 40 according to an exemplary embodiment of the present invention.

Referring to FIG. 3, a light emitting diode 20 may include a substrate 21, a light emitting structure 30, and a lower distributed Bragg reflector 40. Further, the LED 20 may include a buffer layer 23, a transparent electrode 31, a first electrode pad 33, a second electrode pad 35, a metal layer 45, and a first upper distributed Bragg reflector 37.

The substrate 21 may be selected from any transparent substrate, for example, a sapphire substrate or a SiC substrate. The substrate 21 may have a pattern on an upper surface thereof, for example a patterned sapphire substrate (PSS) having a pattern on an upper surface thereof. The area of the substrate 21 may determine the total area of a chip. The substrate 21 may have an area of at least 90,000 $\mu m^2$. For example, the substrate 21 may have an area of at least 1 mm.

The light emitting structure 30 is located on the substrate 21. The light emitting structure 30 includes a first conductivity-type semiconductor layer 25, a second conductivity-type semiconductor layer 29, and an active layer 27 interposed between the first and second conductivity-type semiconductor layers 25 and 29. Herein, the first conductivity-type and the second conductivity-type refer to opposite conductivity types. For example, the first conductivity-type may be n-type and the second conductivity-type may be p-type, or vice versa.

The first conductivity-type semiconductor layer 25, the active layer 27, and the second conductivity-type semiconductor layer 29 may be formed of, although not limited to, a GaN-based compound semiconductor material, that is, (Al, In, Ga)N. The active layer 27 is composed of elements to emit light at desired wavelength, for example, UV or blue light. As shown, the first conductivity-type semiconductor layer 25 and/or the second conductivity-type semiconductor layer 29 have a single layer structure or a multilayer structure. Further, the active layer 27 may have a single quantum well structure or a multi-quantum well structure. The buffer layer 23 may be interposed between the substrate 21 and the first conductivity-type semiconductor layer 25.

The first and second conductivity-type semiconductor layers 25 and 29 and the active layer 27 may be formed by metal organic chemical vapor deposition (MOCVD) or molecular beam epitaxy (MBE), and may be patterned to expose some regions of the first conductivity-type semiconductor layer 25 by a photolithography and etching process.

The transparent electrode layer 31 may be formed of, for example, indium tin oxide (ITO) or Ni/Au on the second conductivity-type semiconductor layer 29. The transparent electrode layer 31 has a lower specific resistance than the second conductivity-type semiconductor layer 29 and helps spread electric current. The first electrode pad 33, for example, an n-electrode pad, is formed on the first conductivity-type semiconductor layer 25, and the second electrode pad 35, for example, a p-electrode pad, is formed on the transparent electrode layer 31. As shown, the p-electrode pad 35 may be electrically connected to the second conductivity-type semiconductor layer 29 through the transparent electrode layer 31. Alternatively, the p-electrode pad 35 may directly contact the second conductivity-type semiconductor layer 29.

The lower distributed Bragg reflector 40 is located under the substrate 21. The lower distributed Bragg reflector 40 is formed by alternately stacking layers having different is indices of refraction and has relatively high reflectivity, for example, a reflectivity of at least 90%, not only with respect to light in the blue wavelength range, for example, that is generated in the active layer 27, but also with respect to light in the wavelength region of yellow light or in the wavelength region of green and/or red light. In addition, the lower distributed Bragg reflector 40 may have a reflectivity of at least 90% for wavelengths in the range of, for example, 400 nm to 700 nm.

The lower distributed Bragg reflector 40 has a relatively high reflectivity over a wide wavelength range, and is formed by controlling the optical thickness of each material layer alternately stacked one above another. The lower distributed Bragg reflector 40 may be formed by alternately stacking, for example, a first layer formed of $SiO_2$ and a second layer formed of $TiO_2$. The lower distributed Bragg reflector 40 may be formed by alternately stacking a first layer formed of $SiO_2$ and a second layer formed of $Nb_2O_5$, to thereby form a laminate structure.

U.S. patent application Ser. No. 12/917,937 discloses a light emitting diode which includes a distributed Bragg reflector having a reflectivity of at least 90% with respect to light in the wavelength range of blue, green, and red light. That application discloses a distributed Bragg reflector, which is formed by alternately stacking layers having different indices of refraction, for example, $TiO_2/SiO_2$ layers, to have high reflectivity with respect to light not only in the blue wavelength range but also in the green or red wavelength range. When curing an Ag epoxy paste applied on the distributed Bragg reflector formed by alternately stacking $TiO_2/SiO_2$ layers (41 layers), the distributed Bragg reflector has a lower reflectivity than that of the reflector before curing the Ag epoxy paste. The decrease in reflectivity of the distributed Bragg reflector may be caused by the relatively small number of layers constituting the distributed Bragg reflector, which results in scattering light at an interface between the distributed Bragg reflector and the is Ag epoxy or optical absorption by the Ag epoxy. To prevent the decrease in reflectivity of the distributed Bragg reflector, the number of layers constituting the distributed Bragg reflector may be increased. Meanwhile, an increase in the number of layers constituting the distributed Bragg reflector may reduce an influence by the condition of the interface between the distributed Bragg reflector and the Ag epoxy, but may cause optical loss relating to an optical absorption rate of each of the layers constituting the distributed Bragg reflector, thereby causing a reduction in reflectivity.

Therefore, the LED according to exemplary embodiments of the present invention may prevent optical loss relating to an increase in the number of layers constituting the distributed Bragg reflector by adopting $Nb_2O_5$ having a lower optical absorption rate than $TiO_2$ to form a distributed Bragg reflector of $SiO_2/Nb_2O_5$.

As the number of first and second layers stacked one above another increases, it is possible to reduce influence by other material layers adjoining a lower surface of the lower distributed Bragg reflector 40. When a small number of layers are stacked, the reflectivity of the lower distributed Bragg reflector 40 can be lowered after an adhesive layer, for example, Ag epoxy pastes, is cured. Therefore, the distributed Bragg reflector 40 may be composed of fifty or more layers, that is, 25 pairs or more.

Figure 4:
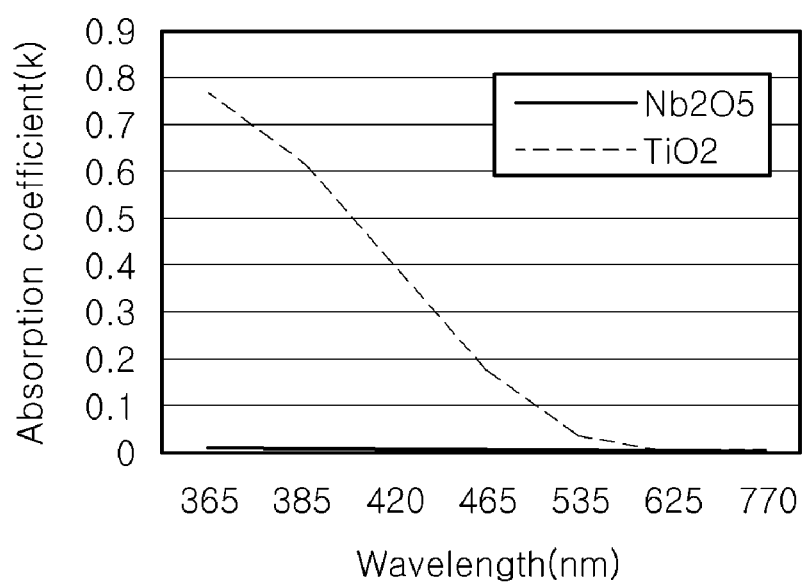
FIG. 4 is a graph showing optical absorption coefficients of $TiO_2$ and $Nb_2O_5$.

Further, as the number of first and second layers stacked one above another increases, the optical absorption rate of the material layers constituting the lower distributed Bragg reflector 40 increases, thereby causing a reduction in reflectivity. FIG. 4 shows variation of the absorption coefficients (K) of $TiO_2$ and $Nb_2O_5$ according to wavelength. $TiO_2$ has an absorption coefficient of zero at 600 nm or more and has an absorption coefficient of about 0.2 with respect to light generated in the active layer 27, for example, light in the blue wavelength range. On the contrary, $Nb_2O_5$ has an absorption coefficient of substantially zero in the visible spectrum. Therefore, even when the lower distributed Bragg reflector 40 is formed by alternately stacking $SiO_2/Nb_2O_5$ to have a large number of stacked layers, the lower distributed Bragg reflector 40 may prevent optical loss caused by optical absorption.

It is not necessary for the first layers or second layers to have the same thickness. The thickness of the first layers or the second layers is set to provide relatively high reflectivity not only with respect to light generated in the active layer 27 but also with respect to light having different wavelengths in the visible spectrum. Further, the lower distributed Bragg reflector 40 may be formed by stacking a plurality of distributed Bragg reflectors, each of which exhibits high reflectivity in a certain wavelength range.

For example, for an LED package including an LED according to an exemplary embodiment that emits white light, light having different wavelengths from that of light emitted from the LED may enter the LED package. In this case, the light having different wavelengths can be reflected by the lower distributed Bragg reflector 40, so that the LED package may have improved light extraction efficiency.

Meanwhile, the uppermost and lowermost layers of the lower distributed Bragg reflector 40 may be $SiO_2$ layers. When the $SiO_2$ layers are stacked as the uppermost and lowermost layers of the lower distributed Bragg reflector 40, the lower distributed Bragg reflector 40 may be stably joined to the substrate 21 and can be protected by the lowermost $SiO_2$ layer.

Referring again to FIG. 3, the metal layer 45 may be located under the lower distributed Bragg reflector 40. The metal layer 45 may be formed of a metallic material such as, for example, aluminum. The metal layer 45 assists dissipation of heat from the LED 20 during is operation of the LED 20. Accordingly, the metal layer 45 may enhance heat dissipation of the LED 20.

Meanwhile, the first upper distributed Bragg reflector 37 may be located on the light emitting structure 30. As shown, the first upper distributed Bragg reflector 37 may cover the transparent electrode layer 31 and an exposed surface of the first conductivity-type semiconductor layer 25.

The first upper distributed Bragg reflector 37 allows light generated in the active layer 27 to pass therethrough while reflecting light entering the LED 20 from outside, for example, light emitted from the phosphors. Accordingly, the first upper distributed Bragg reflector 37 allows light generated in the active layer 27, such as blue light or light in the UV range, to pass therethrough, and reflects light in the green to red wavelength range, in particular, light in the yellow wavelength range.

Figure 5:
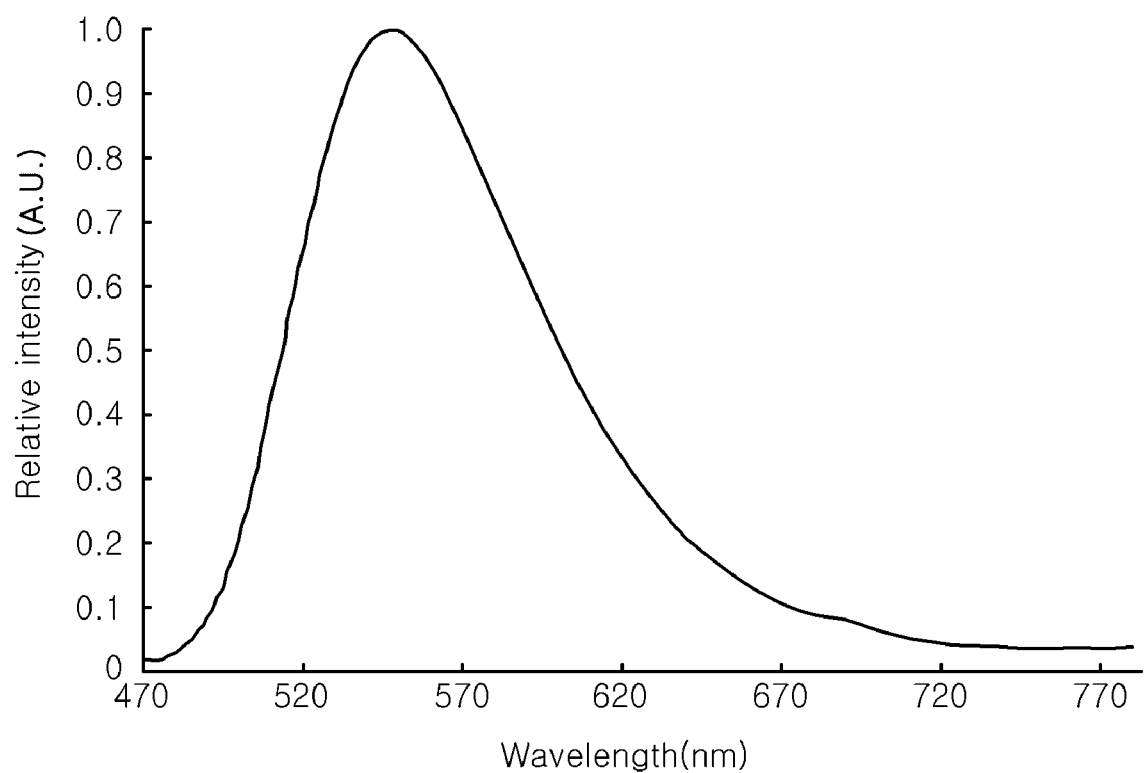
FIG. 5 is a graph showing a luminescence spectrum of a yellow phosphor.
Figure 6:
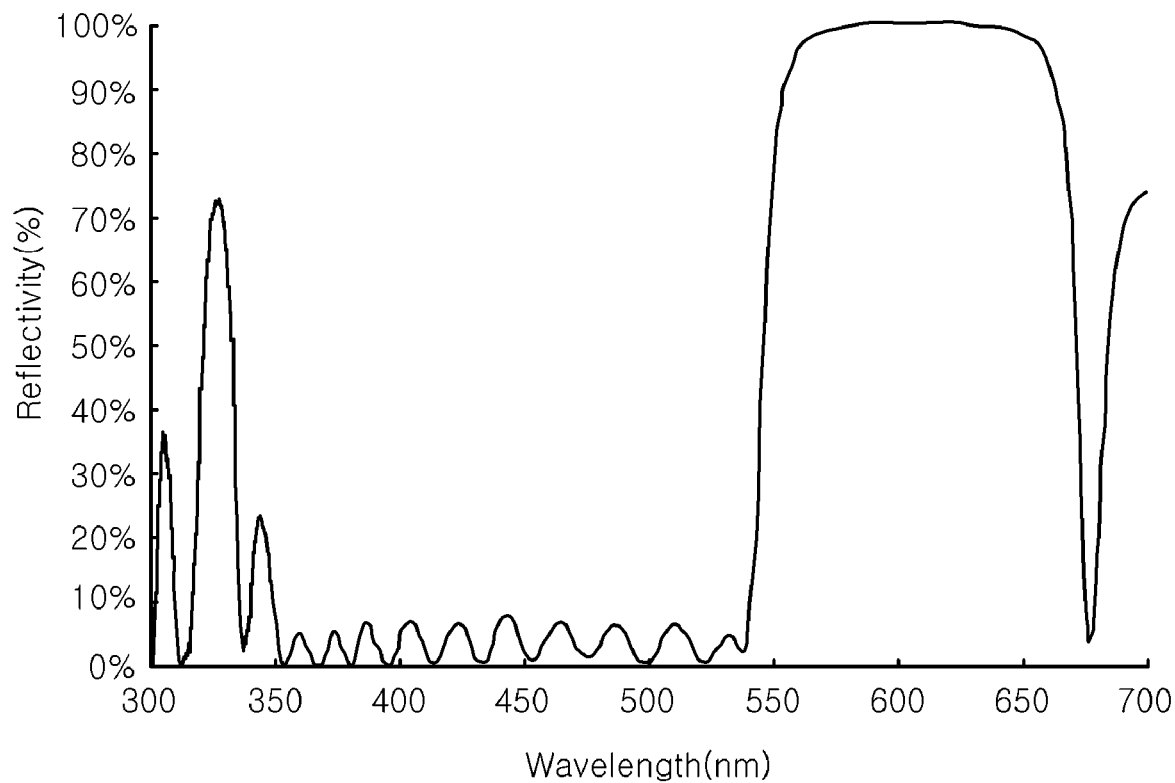
FIG. 6 is a graph showing a reflectance spectrum of a first upper distributed is Bragg reflector.

FIG. 5 is a graph depicting luminescence spectrum of phosphors used for a white light emitting diode package, and FIG. 6 is a graph depicting one example of a reflectance spectrum for the first upper distributed Bragg reflector 37. As shown in FIG. 5, the phosphors used for the LED package for emitting white light exhibit a relatively high emission spectrum in the green to yellow wavelength range. Thus, as shown in FIG. 6, the first upper distributed Bragg reflector 37 may have a reflectance spectrum to allow light emitted from the LED to pass therethrough while reflecting light emitted from the phosphors, that is, light in the green to yellow wavelength range. Such a first upper distributed Bragg reflector 37 may be formed by alternately stacking material layers having different indices of refraction, for example, a $SiO_2$ layer and a $TiO_2$ layer or $Nb_2O_5$ layer, thereby forming a laminate structure. Further, the first upper distributed Bragg reflector 37 may be formed to have a desired reflectance spectrum by setting optical thickness of each of the layers.

The first upper distributed Bragg reflector 37 may also be formed to cover a mesa sidewall and may protect the LED 20 by covering an upper surface of the LED 20 except for upper surfaces of the electrode pads 33 and 35.

Figure 7:
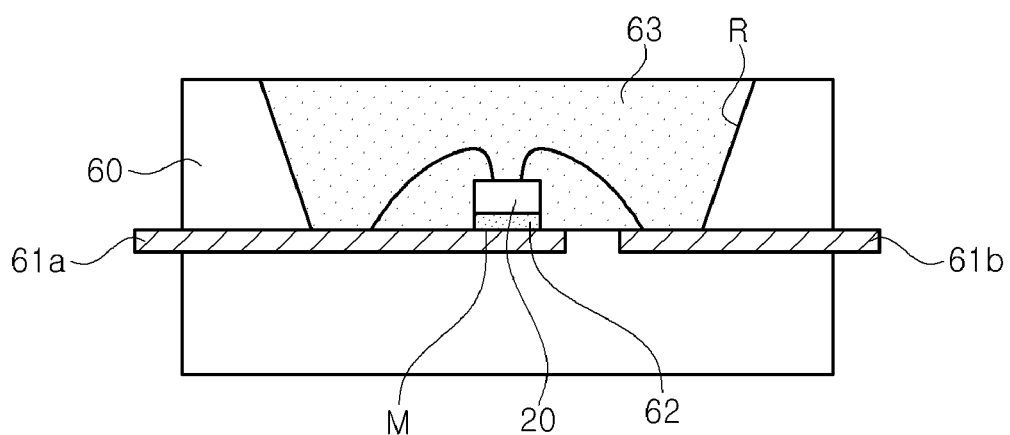
FIG. 7 is a sectional view of an LED package having an LED according to an exemplary embodiment of the present invention.

FIG. 7 is a sectional view of an LED package having the LED 20 mounted thereon according to an exemplary embodiment of the present invention.

Referring to FIG. 7, the LED package includes a package body 60, leads 61a, 61b, the LED 20, and a molding member 63. The package body 60 may be formed of a plastic resin.

The package body 60 has a mounting plane M for mounting the LED 20 and a reflection plane R, from which light emitted from the LED 20 is reflected. The LED 20 is mounted on the mounting plane M and is electrically connected to the leads 61a, 61b via bonding wires. The LED 20 may be bonded to the mounting plane M by adhesives 62, which may be formed by curing, for example, Ag epoxy pastes.

As described in FIG. 3, the LED 20 may include a lower distributed Bragg reflector 40, a metal layer 45, and/or a first upper distributed Bragg reflector 37.

The LED package emits mixed colors, for example, white light. Therefore, the LED package may include phosphors for wavelength conversion of light emitted from the LED 20. The phosphors may be contained in the molding member 63, but are not limited thereto.

Since the LED 20 includes the lower distributed Bragg reflector 40, light subjected to wavelength conversion through the phosphors and directed towards the mounting plane M through the LED 20 is reflected from the lower distributed Bragg reflector 40 to be emitted outside. As a result, the LED package according to the present exemplary embodiment is has a relatively higher light emission efficiency compared to a conventional LED package without a lower distributed Bragg reflector.

In addition, when the LED 20 includes the first upper distributed Bragg reflector 37, light emitted from the phosphors can be reflected from the first upper distributed Bragg reflector 37. Accordingly, it is possible to prevent light emitted from the phosphors from entering the LED 20 and thus causing optical loss.

In the present exemplary embodiment, the LED package is described as including the LED 20 and the phosphors to emit white light, but the invention is not limited thereto. Various LED packages for emitting white light are known in the art and the LED 20 according to the present exemplary embodiment may be applied to any such LED package.

Figure 8:
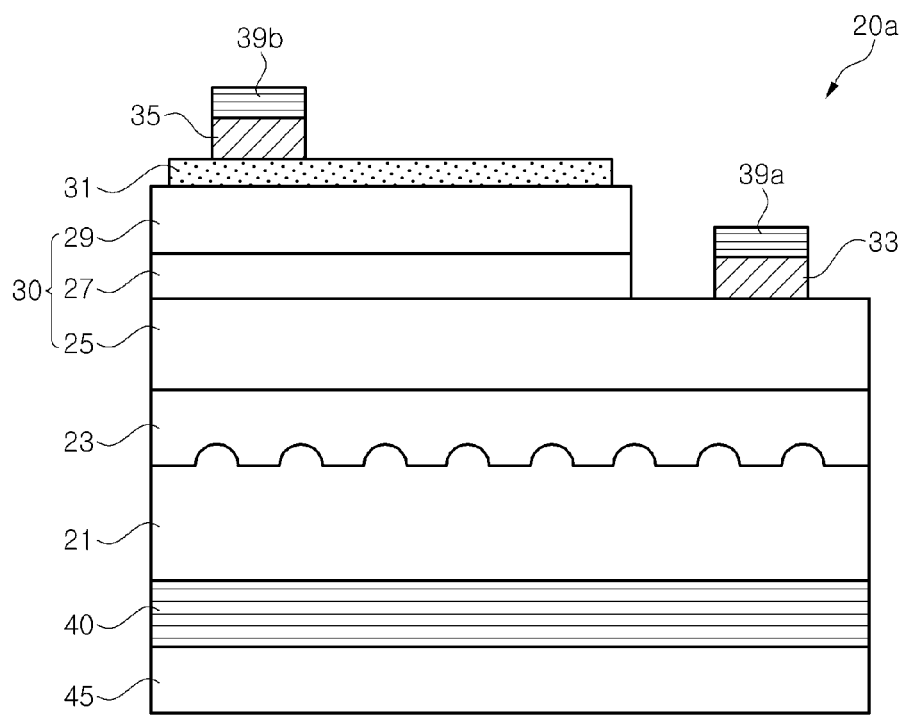
FIG. 8 is a sectional view of an LED having a distributed Bragg reflector according to an exemplary embodiment of the present invention.

FIG. 8 is a sectional view of an LED having a distributed Bragg reflector according to an exemplary embodiment of the present invention.

Referring to FIG. 8, an LED 20a is generally similar to the LED 20 described with reference to FIG. 3, except for second upper distributed Bragg reflectors 39a and 39b respectively formed on electrode pads 33 and 35. The second upper distributed Bragg reflectors 39a and 39b are formed on upper surfaces of the electrode pads 33 and 35, excluding regions for wire bonding (not shown).

The second upper distributed Bragg reflectors 39a and 39b reflect incident light from outside, specifically, light which has a longer wavelength than that of light generated in the active layer 27 and is in at least a part of the visible spectrum. The second upper distributed Bragg reflectors 39a and 39b may reflect, for example, light subjected to wavelength conversion by the phosphors.

Since the electrode pads 33 and 35 may be formed of a light absorbing metal, is light generated in the active layer 27 is not emitted outside through the electrode pads 33 and 35.

Accordingly, it is not necessary for the second upper distributed Bragg reflectors 39a and 39b to allow the light generated in the active layer 27 to pass therethrough. Such second upper distributed Bragg reflectors 39a and 39b may be formed by alternately stacking material layers having different indices of refraction, for example a $SiO_2$ layer and a $TiO_2$ layer or $Nb_2O_5$ layer. Further, the second upper distributed Bragg reflectors 39a and 39b may be formed to have a desired reflectance spectrum by suitably setting optical thickness of each of the layers.

Figure 9:
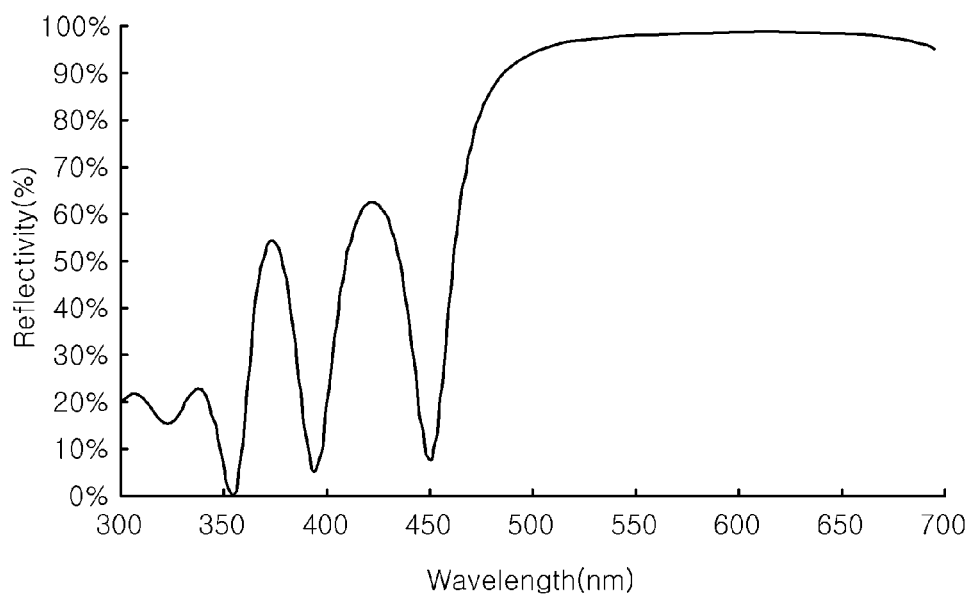
FIG. 9 is a graph showing a reflectance spectrum of a second upper distributed Bragg reflector.

FIG. 9 is a graph depicting one example of a reflectance spectrum for the second upper distributed Bragg reflectors 39a and 39b.

Referring to FIG. 9, the second upper distributed Bragg reflectors 39a and 39b exhibit relatively high reflectivity with respect to light in the green to red wavelength range and may also exhibit relatively high reflectivity with respect to light in the blue wavelength range since it is not necessary to allow light in the blue wavelength range to pass therethrough.

The LED 20a according to the present exemplary embodiment may be mounted instead of the LED 20 on the LED package described with reference to FIG. 7.

In the present exemplary embodiment, the LED 20a may further include a first upper distributed Bragg reflector 37, as described with reference to FIG. 3.

Figure 10:
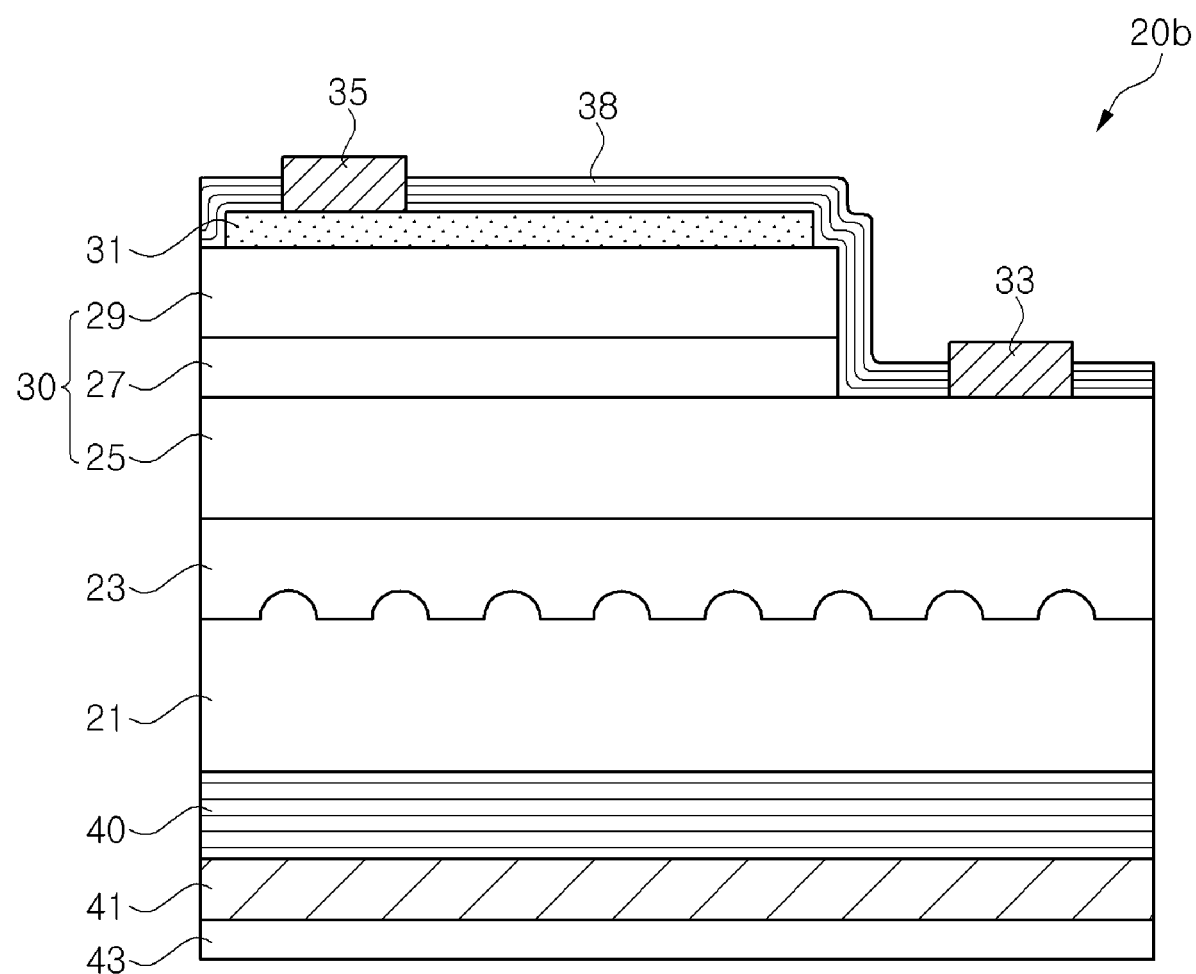
FIG. 10 is a sectional view of an LED having a distributed Bragg reflector according to an exemplary embodiment of the present invention.

FIG. 10 is a sectional view of an LED 20b having a distributed Bragg reflector 40 according to an exemplary embodiment of the present invention.

Referring to FIG. 10, the LED 20b includes a substrate 21, a light emitting structure 30, a distributed Bragg reflector 40, an upper insulation layer 38, and a reflective metal layer 41. Further, the LED 20b may include a buffer layer 23, a transparent electrode 31, a first electrode pad 33, and a second electrode pad 35.

The substrate 21, the light emitting structure 30, the distributed Bragg reflector 40, the buffer layer 23, the transparent electrode layer 31, the first electrode pad 33, and the second electrode pad 35 have similar configurations to those of the LED 20 described with reference to FIG. 3, and detailed descriptions thereof will be omitted herein.

The reflective metal layer 41 is located under the distributed Bragg reflector 40. The reflective metal layer 41 has high reflectivity and may be, for example, an aluminum layer or a silver (Ag) layer. The reflective metal layer 41 reflects incident light having a large angle of incidence and passing through the distributed Bragg reflector 40. Further, a protective layer 43 may be located under the reflective metal layer 41. The protective layer 43 covers the reflective metal layer 41 to prevent deformation of the reflective metal layer 41 due to oxidation or diffusion of the reflective metal layer 41. The protective layer 43 may be formed of a metal or an insulation material. The protective layer 43 may be formed of a metal to improve dissipation of heat from the LED.

The upper insulation layer 38 may be located on the light emitting structure 30. The upper insulation layer 38 covers the light emitting structure 30 to protect the light emitting structure 30 from external environmental factors. As shown, the upper insulation layer 38 may cover the transparent electrode layer 31. Further, the upper insulation layer 38 may cover a mesa sidewall and an exposed surface of the first conductivity-type semiconductor layer 25 formed by mesa etching.

The upper insulation layer 38 may be formed of a transparent material, for example $SiO_2$, which allows light generated in the active layer 27 to pass therethrough. In addition, the upper insulation layer 38 may be a refractive index-grading layer, the index of refraction of which decreases in a gradual or stepwise manner in a direction away from the light is emitting structure 30. For example, the refractive index-grading layer may be formed by sequentially depositing a relatively high density layer and a relatively low density layer through variation of process parameters, such as deposition rate, temperature, pressure, reaction gas flux, and plasma power, when forming the upper insulation layer 38 using a chemical vapor deposition (CVD) process. Since the index of refraction of the upper insulation layer 38 gradually decreases towards an outside surface in a direction away from the light emitting structure 30, it is possible to reduce total internal reflection of light which is emitted through the upper insulation layer 38.

The transparent electrode layer 31 may be formed of, for example, indium tin oxide (ITO) or ZnO on the second conductivity-type semiconductor layer 29. The transparent electrode layer 31 may be interposed between the second conductivity-type semiconductor layer 29 and the upper insulation layer 38. The transparent electrode layer 31 has a lower specific resistance than the second conductivity-type semiconductor layer 29, thereby assisting current spreading. The transparent electrode layer 31 may be formed by thermal deposition, electron beam deposition, ion beam-assisted deposition, or sputtering. Here, the transparent electrode layer 31 may be a low refractive index layer having a relatively low index of refraction or may be a refractive index-grading layer, the index of refraction of which decreases in a gradual or stepwise manner in a direction away from the second conductivity-type semiconductor layer 29.

The LED 20b according to the present exemplary embodiment may be mounted instead of the LED 20 on the LED package described with reference to FIG. 7. As described in FIG. 10, the LED 20b includes the distributed Bragg reflector 40, the reflective metal layer 41, and the upper insulation layer 38. In addition, when the upper insulation layer 38 and/or the transparent electrode layer 31 are the refractive index-grading layers, the LED 20b may exhibit is further improved light extraction efficiency, thereby further reducing optical loss inside the LED 20b. Further, the upper insulation layer 38 may be formed on the first and second electrode pads 33 and 35, similar to as described above with reference to the second upper distributed Bragg reflector 39a and 39b in FIG. 8.

Figure 11:
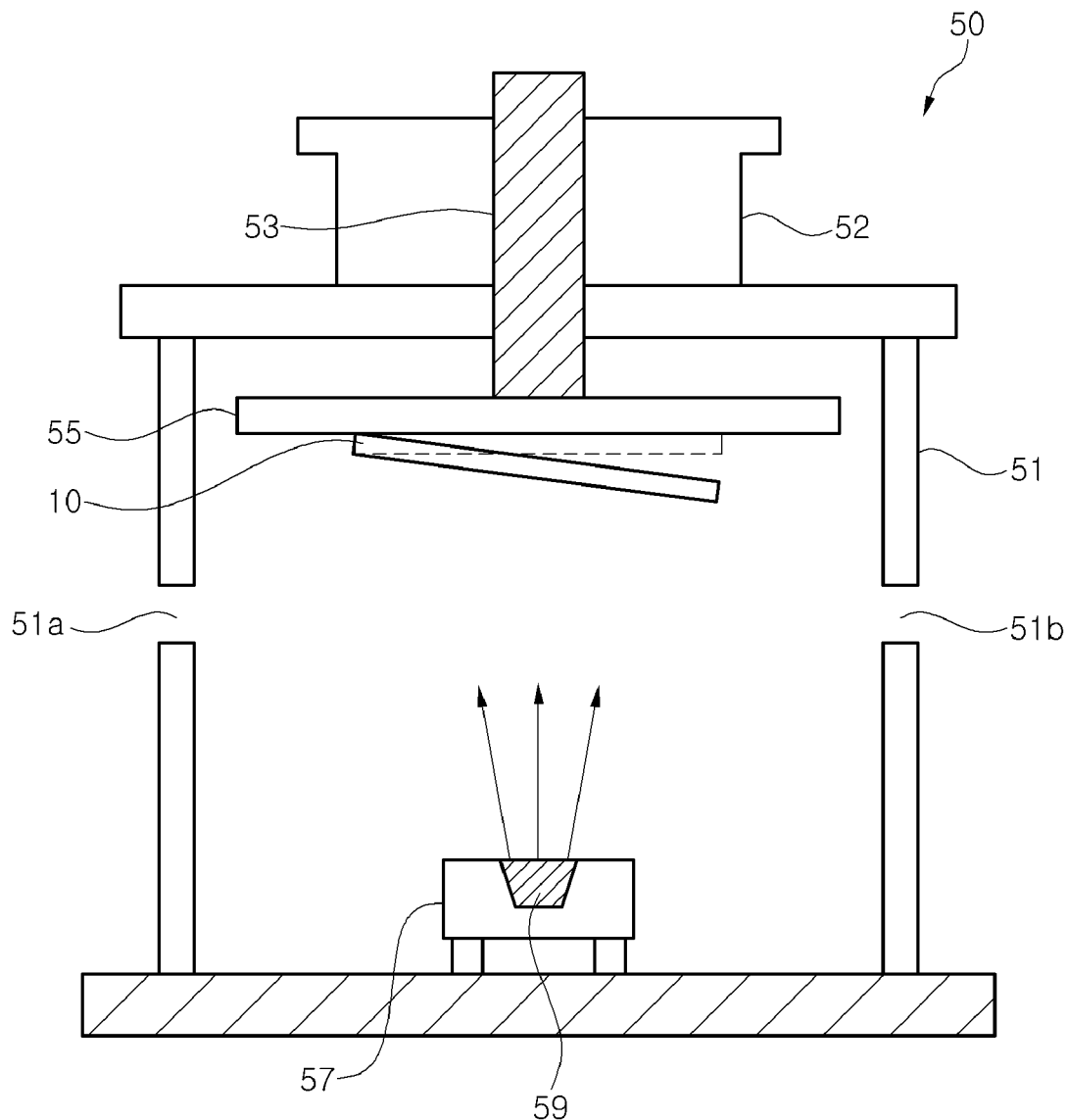
FIG. 11 is a schematic sectional view of an electron beam deposition apparatus, according to an exemplary embodiment of the present invention.

FIG. 11 is a schematic sectional view of an electron beam deposition apparatus 50 for forming a transparent conductive layer (not shown) having a relatively low index of refraction.

Referring to FIG. 11, the electron beam deposition apparatus includes a vacuum chamber 51, a substrate holder 55, a rotator 52, a shaft 53, an electron beam evaporator 57, and a source 59, in which the vacuum chamber 51 is formed with a gas inlet 51a and a gas outlet 51b.

The substrate 10 has a second conductivity-type semiconductor layer 29, which is formed by growing semiconductor layers on a substrate 21 such as a sapphire substrate. The substrate 10 is disposed on the substrate holder 55. Generally, a plurality of substrates 10 is arranged on the substrate holder 55 and each of the substrates 10 is disposed such that an upper surface of the substrate faces the source 59. In other words, the source 10 is disposed on a line perpendicular to the surface of the substrate 10 and extending to the center of the substrate 10. The substrate holder 55 may have a concave shape to allow each of the substrates 10 to be disposed at a normal position (indicated by a dotted line) with respect to the source 59. Further, the substrate holder 55 may be rotated by the rotator 52. Namely, the rotator 52 rotates the shaft 53, which in turn rotates the substrate holder 55. As the substrate holder 55 is rotated as described above, the transparent electrode layer may be uniformly deposited on the substrate 10, in particular, on the plurality of substrates 10.

In the present exemplary embodiment, the substrate 10 may also be disposed at an angle with respect to the source 59 instead of being disposed at a normal position (indicated by a dotted line). Namely, the source 59 is deviated from the line perpendicular to the surface of the substrate 10 and extending to the center of the substrate 10. When the plurality of substrates 10 is disposed in the deposition apparatus, each of the substrates 10 may be disposed at an identical angle with respect to the source 59.

When a transparent electrode layer is deposited on the substrate 10 by evaporating the source 59 with an electron beam, the transparent electrode layer is deposited in a slanted direction on the substrate 10 instead of being deposited perpendicular to the substrate 10. As a result, as compared with the case where the transparent electrode layer is deposited on substrate 10 at the normal position, the transparent electrode layer has a low density, so that the index of refraction of the transparent electrode layer may be decreased. Accordingly, it is possible to reduce optical loss relating to total internal reflection at an interface between the transparent electrode layer and air or between the transparent electrode layer and the upper insulation layer 38.

In addition, in the present exemplary embodiment, the transparent electrode layer may be asymmetrically deposited on the substrate 10 by stopping rotation of the substrate 10 or changing a rotational condition of the substrate 10, which is rotated by the rotator 52. Accordingly, it is possible to deposit a transparent electrode layer which has a low index of refraction.

In the present exemplary embodiment, the electron beam deposition apparatus 50 has been illustrated for deposition of the transparent electrode layer. However, thermal deposition and ion beam-assisted deposition may also be performed under the condition that the substrate 10 is disposed at an angle with respect to the target or that the rotational speed of the is substrate is adjusted. In addition, deposition of the transparent electrode layer having a low index of refraction using sputtering may also be performed, with the substrate disposed at an angle with respect to the target.

Figure 12:
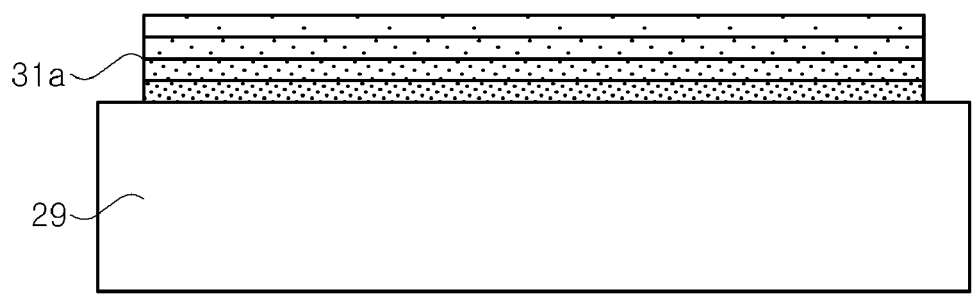
FIG. 12 is a sectional view of a transparent conductive layer according to an exemplary embodiment of the invention.

FIG. 12 is a sectional view of an example of the transparent conductive layer 31 according to the exemplary embodiment of the present invention described above with reference to FIGS. 10 and 11.

Referring to FIG. 12, a transparent electrode layer 31a of the present exemplary embodiment is similar to the transparent electrode layer 31 described with reference to FIG. 10 except that the transparent electrode layer 31a is a refractive index-grading layer. Specifically, the transparent electrode layer 31a is a refractive index-grading layer, the index of refraction of which decreases in a gradual or stepwise manner in a direction away from the second conductivity-type semiconductor layer 29.

The transparent electrode layer 31a may be formed by thermal deposition, electron beam deposition, ion beam-assisted deposition, or sputtering. In this case, the transparent electrode layer 31a may be formed as the refractive index-grading layer by sequentially depositing a relatively high density layer and a relatively low density layer through variation of process parameters, such as deposition rate, temperature, pressure, reaction gas flux, and plasma power. Since the index of refraction of the transparent electrode layer 31a gradually decreases towards an outside from the second conductivity-type semiconductor layer 29, it is possible to reduce total internal reflection of light emitted through the second conductivity-type semiconductor layer 29.

As such, according to the exemplary embodiments of the present invention, the LED may include a distributed Bragg reflector exhibiting relatively high reflectivity with respect is to light over a wide wavelength range of the visible spectrum, thereby improving light emission efficiency of an LED package for emitting mixed colors, for example, white light. In addition, the LED may reduce optical absorption of the distributed Bragg reflector by alternately stacking $SiO_2/Nb_2O_5$ to form the distributed Bragg reflector, thereby increasing the number of layers constituting the distributed Bragg reflector while maintaining high reflectivity after mounting the LED in the LED package. Further, the LED may include a metal layer under the distributed Bragg reflector, thereby improving dissipation of heat from the LED. Further, the LED may include an upper distributed Bragg reflector on the light emitting structure or on an upper surface of an electrode pad, thereby reducing optical loss of light which enters the LED from outside. Furthermore, the LED may include a reflective metal layer and a protective layer on a lower surface of the distributed Bragg reflector, thereby preventing deformation of the distributed Bragg reflector and the reflective metal layer when the LED is mounted on the package. In addition, an upper insulation layer and/or a transparent conductive layer may be a refractive index-grading layer, thereby improving light extraction efficiency of the LED.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention covers the modifications and variations provided they fall within the scope of is the appended claims and their equivalents.

What is claimed is:

1. A light-emitting diode (LED), comprising:
   a light-emitting structure arranged on a first surface of a substrate, the light-emitting structure comprising:
   a first conductivity-type semiconductor layer;
   a second conductivity-type semiconductor layer; and
   an active layer interposed between the first conductivity-type semiconductor layer and the second conductivity-type semiconductor layer; and
   a first distributed Bragg reflector arranged on a second surface of the substrate opposite to the first surface, the first distributed Bragg reflector to reflect light emitted from the light emitting structure,
   wherein the first distributed Bragg reflector comprises a reflectivity of at least 90% with respect to light of a first wavelength in a blue wavelength range, light of a second wavelength in a green wavelength range, and light of a third wavelength in a red wavelength range, and
   wherein the first distributed Bragg reflector comprises a laminate structure comprising alternately stacked $SiO_2$ and $Nb_2O_5$ layers.

2. The LED of claim 1, wherein the first distributed Bragg reflector comprises at least 25 pairs of $SiO_2/Nb_2O_5$ layers.

3. The LED of claim 2, wherein a $SiO_2$ layer of the first distributed Bragg reflector directly contacts the second surface of the substrate.

4. The LED of claim 3, wherein the first distributed Bragg reflector comprises a $SiO_2$ layer as the lowermost layer opposite to the $SiO_2$ layer directly contacting the second surface of the substrate.

5. The LED of claim 1, further comprising a metal layer, wherein the first distributed Bragg reflector is arranged between the substrate and the metal layer.

6. The LED of claim 1, further comprising:
   a second distributed Bragg reflector arranged on the light emitting structure,
   the second distributed Bragg reflector to allow light generated in the active layer to pass therethrough and to reflect an external light, the external light comprising a longer wavelength than that of light generated in the active layer and being in at least a partial region of the visible spectrum.

7. The LED of claim 6, wherein the second distributed Bragg reflector reflects light in a wavelength range of at least yellow light.

8. The LED of claim 6, further comprising:
   a first electrode pad electrically connected to the first conductivity-type semiconductor layer;
   a second electrode pad electrically connected to the second conductivity-type semiconductor layer; and
   a third distributed Bragg reflector arranged on at least one of the first electrode pad and the second electrode pad, the third distributed Bragg reflector to reflect the external light.

9. The LED of claim 8, wherein the third distributed Bragg reflector is to reflect light in a wavelength range of at least yellow light.

10. The LED of claim 1, further comprising:
    a first electrode pad electrically connected to the first conductivity-type semiconductor layer;
    a second electrode pad electrically connected to the second conductivity-type semiconductor layer; and
    a second distributed Bragg reflector arranged on at least one of the first electrode pad and the second electrode pad, the second distributed Bragg reflector to reflect an external light, the external light comprising a wavelength longer than that of light generated in the active layer and being in at least a partial region of the visible spectrum.

11. The LED of claim 10, wherein the second distributed Bragg reflector reflects light in a wavelength range of at least yellow light.

12. A light-emitting diode (LED) package, comprising:
    a mounting plane;
    the LED according to claim 1 arranged on the mounting plane; and
    a phosphor to convert a wavelength of light emitted from the LED.

13. The LED package of claim 12, further comprising an Ag epoxy bonding the LED to the mounting plane.

14. A light-emitting diode (LED), comprising:
    a light-emitting structure arranged on a first surface of a substrate, the light-emitting structure comprising:
    a first conductivity-type semiconductor layer;
    a second conductivity-type semiconductor layer; and
    an active layer interposed between the first conductivity-type semiconductor layer and the second conductivity-type semiconductor layer;
    an insulation layer arranged on the light emitting structure;
    a distributed Bragg reflector arranged on a second surface of the substrate opposite to the first surface, the distributed Bragg reflector to reflect light emitted from the light-emitting structure and comprising a reflectivity of at least 90% with respect to light of a first wavelength in a blue wavelength range, light of a second wavelength in a green wavelength range, and light of a third wavelength in a red wavelength range; and a reflective metal layer, wherein the distributed Bragg reflector is arranged between the substrate and the reflective metal layer.

15. The LED of claim 14, wherein the distributed Bragg reflector comprises a laminate structure comprising $SiO_2$ layers that are alternately stacked with $TiO_2$ layers or $Nb_2O_5$ layers, or a combination of $TiO_2$ and $Nb_2O_5$ layers.

16. The LED of claim 14, wherein the distributed Bragg reflector comprises at least 25 pairs of $SiO_2/Nb_2O_5$ layers.

17. The LED of claim 14, wherein a $SiO_2$ layer of the distributed Bragg reflector directly contacts the second surface of the substrate.

18. The LED of claim 17, wherein the distributed Bragg reflector comprises a $SiO_2$ layer as the lowermost layer opposite to the $SiO_2$ layer directly contacting the second surface of the substrate.

19. The LED of claim 14, further comprising a protective layer, wherein the reflective metal layer is arranged between the distributed Bragg reflector and the protective layer.

20. The LED of claim 14, wherein the insulation layer comprises a refractive index-grading layer, an index of refraction of which decreases in a gradual or stepwise manner in a direction away from the light-emitting structure.

21. The LED of claim 20, wherein the insulation layer comprises $SiO_2$.

22. The LED of claim 14, further comprising a transparent conductive layer interposed between the second conductivity-type semiconductor layer and the insulation layer.

23. The LED of claim 22, wherein the transparent conductive layer comprises a refractive index-grading layer, an index of refraction of which decreases in a gradual or stepwise manner in a direction away from the second conductivity-type semiconductor layer.

24. The LED of claim 23, wherein the transparent conductive layer comprises indium tin oxide (ITO) or ZnO.

25. The LED of claim 22, wherein the transparent conductive layer is formed on the substrate by a deposition process comprising thermal deposition, electron beam deposition, ion beam-assisted deposition, or sputtering, and wherein the substrate is disposed at an angle with respect to a source or a target during the deposition process, the transparent conductive layer formed on the angled substrate comprising a lower index of refraction than a transparent conductive layer formed by deposition on a substrate disposed at a normal position with respect to the source or the target.

26. A light-emitting diode (LED), comprising:

a substrate;

a light emitter arranged on a first surface of the substrate; and a first distributed Bragg reflector arranged on an opposing second surface of the substrate and configured to reflect light emitted from the light emitter, the first distributed Bragg reflector comprising $SiO_2$ layers and $Nb_2O_5$ layers that are alternately arranged on each other; and a second distributed Bragg reflector arranged on the light emitter and configured to transmit the light emitted from the light emitter and to reflect visible external light having a longer wavelength than that of the light generated in the light emitter.

* * * * *